(12) United States Patent
Lee et al.

(10) Patent No.: US 10,608,665 B2
(45) Date of Patent: Mar. 31, 2020

(54) METHOD AND APPARATUS FOR ERROR CORRECTION CODING IN COMMUNICATION

(71) Applicant: MEDIATEK INC., Hsinchu (TW)

(72) Inventors: Chong-You Lee, Hsinchu (TW); Timothy Perrin Fisher-Jeffes, San Jose, CA (US); Maoching Chiu, Hsinchu (TW); Wei Jen Chen, Hsinchu (TW); Cheng-Yi Hsu, Hsinchu (TW); Ju-Ya Chen, Hsinchu (TW); Yen Shuo Chang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 15/917,260

(22) Filed: Mar. 9, 2018

(65) Prior Publication Data

US 2018/0278267 A1 Sep. 27, 2018

Related U.S. Application Data

(60) Provisional application No. 62/475,953, filed on Mar. 24, 2017.

(51) Int. Cl.
*H03M 13/00* (2006.01)
*H03M 13/11* (2006.01)
(Continued)

(52) U.S. Cl.
CPC ........ *H03M 13/116* (2013.01); *H03M 13/118* (2013.01); *H03M 13/15* (2013.01);
(Continued)

(58) Field of Classification Search
CPC .. H03M 13/116; H03M 13/118; H03M 13/15; H03M 13/6516; H03M 13/616;
(Continued)

(56) References Cited

U.S. PATENT DOCUMENTS 8,347,200 B1 *   1/2013   Jakka ................. H03M 13/1102
                                                             714/776
8,504,894 B1 *   8/2013   Zeng .................... H03M 13/116
                                                             714/758
(Continued)

FOREIGN PATENT DOCUMENTS

CN         104205647 A      12/2014
WO    WO 2008/124966 A1    10/2008

OTHER PUBLICATIONS

International Search Report and Written Opinion dated May 31, 2018 in PCT/CN2018/079224 (English Translation only), 9 pages.
(Continued)

*Primary Examiner* — Guerrier Merant
(74) *Attorney, Agent, or Firm* — Oblon, McClelland, Maier & Neustadt, L.L.P.

(57) ABSTRACT

Aspects of the disclosure provide an apparatus and a method for error correction based on a matrix. The apparatus includes memory and processing circuitry. The memory is configured to store the matrix associated with a set of parity bits. The matrix having rows and columns includes elements having values corresponding to either a first state or a second state. The matrix also includes a row having two elements with values corresponding to the first state. One of the two elements is a parity element corresponding to a parity bit associated with the row. Further, other elements in a same column as the parity element have values corresponding to the second state. The processing circuitry is configured to implement error correction based on the matrix. In another embodiment, the processing circuitry is configured to encode a data unit by generating the set of parity bits from the data unit based on the matrix and to form a codeword that includes the data unit and the set of parity bits. The processing circuitry is also configured to decode a received
(Continued)

codeword having a received data unit based on the matrix and to obtain a decoded data unit.

16 Claims, 7 Drawing Sheets

(51) Int. Cl.
*H03M 13/15* (2006.01)
*H03M 13/25* (2006.01)

(52) U.S. Cl.
CPC ....... *H03M 13/616* (2013.01); *H03M 13/618* (2013.01); *H03M 13/6306* (2013.01); *H03M 13/6516* (2013.01); *H03M 13/255* (2013.01)

(58) Field of Classification Search
CPC .......... H03M 13/618; H03M 13/6306; H03M 13/255; H03M 13/611; H03M 13/1102; H03M 13/6561; H03M 13/13; H03M 13/6505; H03M 13/114; H03M 13/112; H03M 13/6502; H03M 13/6356; H03M 13/6393; H03M 13/036; H03M 13/1168; H03M 13/1185; G06F 11/10; H01M 10/38; H04L 1/0063; H04L 1/00; H04L 1/0013; H04L 1/1819; H04L 1/0071
See application file for complete search history.

(56) References Cited

U.S. PATENT DOCUMENTS

| | | | |
|---|---|---|---|
| 8,990,661 | B1 | 3/2015 | Micheloni et al. |
| 9,813,080 | B1* | 11/2017 | Micheloni ............ H03M 13/114 |
| 2009/0031185 | A1* | 1/2009 | Xhafa ................... H04L 1/0013 |
| | | | 714/751 |
| 2013/0283131 | A1 | 10/2013 | Tsatsaragkos et al. |
| 2015/0089320 | A1 | 3/2015 | Jeong et al. |
| 2016/0094245 | A1 | 3/2016 | Landau et al. |
| 2017/0109233 | A1* | 4/2017 | Ilani ..................... H03M 13/116 |
| 2017/0201348 | A1* | 7/2017 | Jang ..................... H03M 13/036 |
| 2017/0271718 | A1* | 9/2017 | Jang ..................... H01M 10/38 |

OTHER PUBLICATIONS

Combined Office Action and Search Report dated May 7, 2019 in Chinese Patent Application No. 201880000877.7 (with English translation of categories of cited documents).

Combined Taiwanese Office Action and Search Report dated Jul. 29, 2019 in Taiwanese Patent Application No. 107108638 (with English translation of Category of Cited Documents), 8 pages.

\* cited by examiner

FIG. 2A

DATA UNIT 202 | 1ST SET OF PARITY BITS 203 — 201

FIG. 2B

DATA UNIT 202 | 3RD SET OF PARITY BITS 213 | 2ND SET OF PARITY BITS 214 — 215

METHOD AND APPARATUS FOR ERROR CORRECTION CODING IN COMMUNICATION

INCORPORATION BY REFERENCE

This present disclosure claims the benefit of U.S. Provisional Application No. 62/475,953, "Weight-2 Row Extension Design for NR LDPC Code" filed on Mar. 24, 2017, which is incorporated herein by reference in its entirety.

TECHNICAL FIELD

The technical field of this invention is about wireless communication technology, more specifically, the error correcting codes in the wireless communication technology.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In wireless communication, electromagnetic signals are used to transmit digital data. The digital data may be incorrectly delivered due to various reasons. In an example, some bits in the digital data can get corrupted due to for example, noise, signal distortion, interference, and the like. Error correcting codes can be used in wireless communication technology for controlling errors in data transmission over unreliable or noisy communication channels.

SUMMARY

Aspects of the disclosure provide an apparatus that includes memory and processing circuitry. The memory is configured to store a matrix that is used in error correction and is associated with a set of parity bits. The matrix having rows and columns includes elements having values corresponding to either a first state or a second state, and a row having two elements with values corresponding to the first state. One of the two elements is a parity element corresponding to a parity bit associated with the row. Other elements in a same column of the matrix as the parity element have values corresponding to the second state. The processing circuitry can be configured to implement error correction based on the matrix.

In an embodiment, the processing circuitry can be further configured to implement error correction by generating the set of parity bits from a data unit based on the matrix and to encode the data unit into a codeword that includes the data unit and the set of parity bits. In another embodiment, the processing circuitry is further configured to receive a codeword including a data unit and the set of parity bits, and to implement error correction by decoding the codeword based on the matrix and to generate a decoded data unit.

In an embodiment, the matrix is used in a quasi-cyclic low density parity check (QC-LDPC) code to form a parity check matrix (PCM), and the matrix is sparse including less elements with values corresponding to the first state than elements with values corresponding to the second state.

In some examples, the processing circuitry is further configured to generate a shift-coefficient table and to form a PCM having elements of 0 and 1 from the matrix by replacing each element having a value corresponding to the first state with a quasi-cyclic (QC) matrix column-shifted according to the shift-coefficient table from an identity matrix of a size based on a lifting factor, and replacing each element having a value corresponding to the second state with a zero matrix having the same size as the identity matrix. Further, the processing circuitry is configured to encode or decode using a LDPC code based on the PCM.

In an embodiment, the matrix further includes a second row, and the matrix includes a submatrix having the second row and an extension matrix having the row.

In an example, the memory is a non-volatile memory.

In an embodiment, the matrix is a parity check matrix used in a LDPC code, and an element having a value corresponding to the first state is 1 and an element having a value corresponding to the second state is 0.

Aspects of the disclosure provide an apparatus that includes processing circuitry and memory. The processing circuitry can be configured to generate and transmit a digital signal that includes a data unit and a first set of parity bits used for error correction. The processing circuitry can further be configured to generate and transmit a second set of parity bits that corresponds to a retransmission of a subset of bits from the data unit and/or the first set of parity bits based on error correction instructions. The memory is configured to store the error correction instructions.

In an embodiment, the error correction instructions include characteristics of the subset of bits in the digital signal to be retransmitted. In another embodiment, the error correction instructions can also include a matrix having elements with values corresponding to either a first state or a second state and a row having two elements with values corresponding to the first state. The processing circuitry is further configured to generate the second set of parity bits according to the matrix.

Aspects of the disclosure provide a method that comprises storing a matrix that is used in error correction and is associated with a set of parity bits, and encoding/decoding a digital signal based on the matrix. The matrix having rows and columns includes elements having values corresponding to either a first state or a second state, and a row having two elements with values corresponding to the first state. One of the two elements is a parity element corresponding to a parity bit associated with the row. Further, other elements in a same column as the parity element have values corresponding to the second state.

In an embodiment, the digital signal is a data unit having a set of information bits, and encoding the digital signal is implemented by generating the set of parity bits from the data unit based on the matrix and to form a codeword including the data unit and the set of parity bits.

In an embodiment, the method further includes receiving a digital signal including a data unit and the set of parity bits, and decoding the digital signal is implemented by decoding based on the matrix to generate a decoded data unit.

In an embodiment, the matrix is used in LDPC code to generate a parity check matrix, and the matrix is sparse including less elements with values corresponding to the first state than elements with values corresponding to the second state.

Aspects of the disclosure provide a method that includes generating and transmitting a digital signal that includes a data unit and a first set of parity bits used for error correction. The method further includes generating and transmitting a second set of parity bits that corresponds to a retransmission of a subset of bits from the data unit and/or the first set of parity bits based on error correction instructions. Further, the method includes storing the error correction instructions.

BRIEF DESCRIPTION OF THE DRAWINGS

Various embodiments of this disclosure that are proposed as examples will be described in detail with reference to the following figures, wherein like numerals reference like elements, and wherein:

FIG. 2A shows an exemplary first codeword 201 according to an embodiment of the disclosure;

FIG. 2B shows an exemplary second codeword 215 according to an embodiment of the disclosure;

FIG. 2C shows an exemplary base matrix 220 and an exemplary shifting-coefficient table 230 according to an embodiment of the disclosure;

DETAILED DESCRIPTION OF EMBODIMENTS

Error correction codes can be used in wireless communication to provide reliable communication. A quasi-cyclic low density parity check (QC-LDPC) code is one of the error correction codes used to further improve performance. The QC-LDPC code can be based on a base matrix that is sparse. A data unit having a set of information bits can be encoded by generating a first set of parity bits from the data unit based on the base matrix, thus forming a first codeword that includes the data unit and the first set of parity bits. The first codeword can have a code rate (CR) corresponding to the base matrix. CR can characterize redundancy of an error correction code. In an example, a lower CR corresponds to higher redundancy and provides more reliable error correction. A lower CR can be obtained by extending the base matrix to include more rows and columns, and thus generating a second codeword having the lower CR. However, extending the base matrix to include more rows and columns can also increase decoding complexity and latency, while the additional coding gain is limited. According to aspects of the disclosure, a weight-2 row extension method can be used to extend the base matrix and decrease the CR without increasing the decoding complexity and latency. The second codeword generated based on the weight-2 row extension method can include the first codeword and a second set of parity bits. In an example, the weight-2 row extension can be used in QC-LDPC in fifth generation mobile network technology (5G) ultra-reliable and low latency communication (URLLC). According to aspects of the disclosure, a second codeword having the lower CR can also be generated by transmitting the first codeword and a subset of the first codeword, thus, the second codeword can include the first codeword, as well as a second set of parity bits corresponding to the subset of the first codeword.

Figure 1:
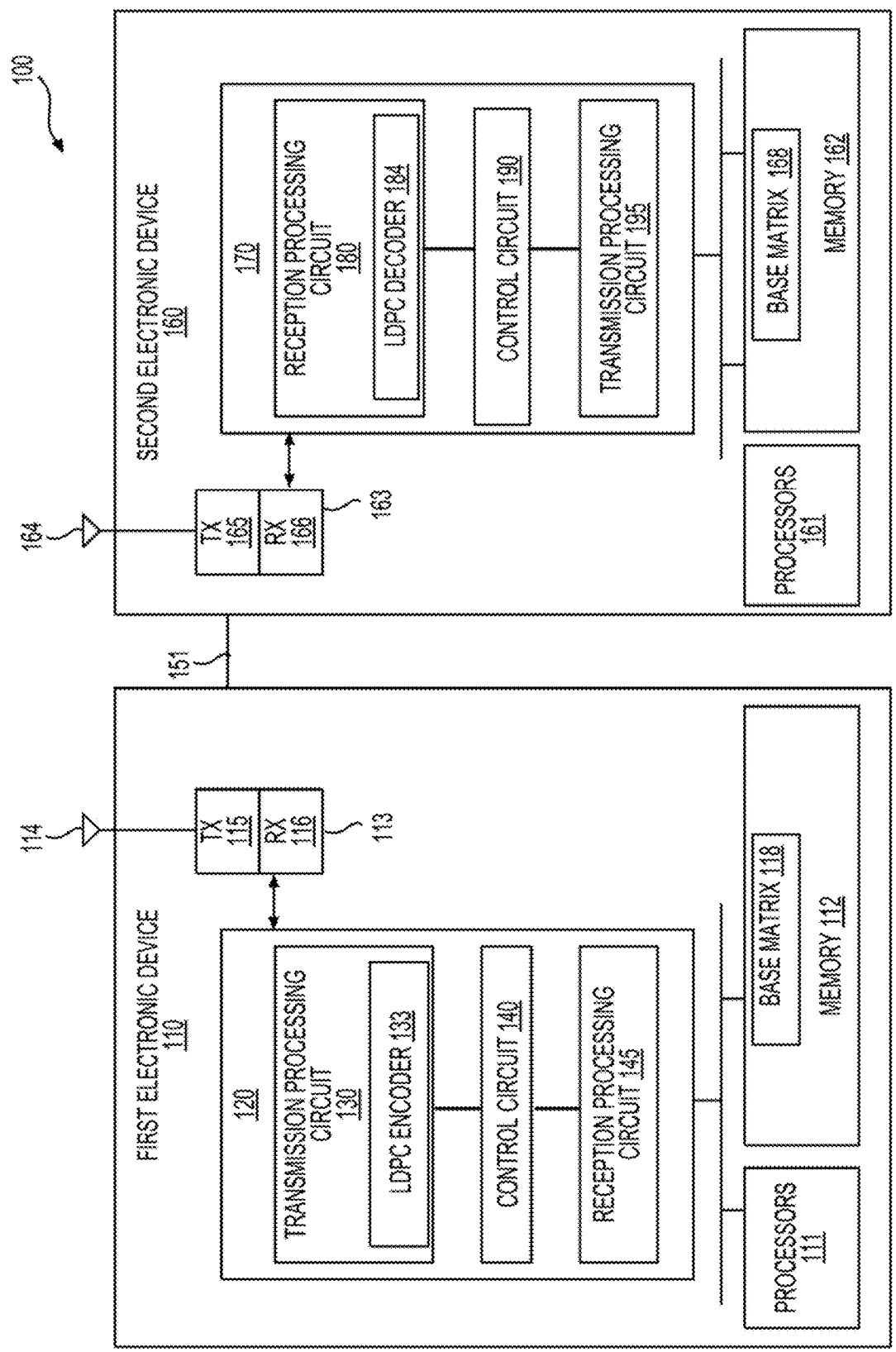
FIG. 1 shows a block diagram of an exemplary communication system 100 according to an embodiment of the disclosure.

FIG. 1 shows a block diagram of an exemplary communication system 100 according to an embodiment of the disclosure. The communication system 100 includes a first electronic device 110 and a second electronic device 160 that are in wireless communication. The first electronic device 110 and the second electronic device 160 are configured to transmit wireless signals carrying digital data having a set of information bits. In an embodiment, the digital data is encoded using QC-LDPC code based on a base matrix having weight-2 row extension. In another embodiment, the digital data is encoded using LDPC code based on a parity check matrix (PCM) having weight-2 row extension. In an embodiment, a first set of parity bits can be generated from the digital data based on an encoding method. Further, a subset of the digital data and the first set of parity bits can be retransmitted. Therefore, a codeword can include the digital data, the first set of parity bits, as well as a second set of parity bits corresponding to the subset of the digital data and the first set of parity bits being retransmitted.

The communication system 100 can be any suitable wireless communication system that uses suitable wireless communication technology, such as second generation (2G) mobile network technology, third generation (3G) mobile network technology, fourth generation (4G) mobile network technology, 5G, global system for mobile communication (GSM), long-term evolution (LTE), a New Radio (NR) access technology, a wireless local area network (WLAN), and the like.

In an example, one of the first electronic device 110 and the second electronic device 160 is an interface node in a telecommunication service provider, and the other electronic device is a terminal device. For example, the first electronic device 110 is the interface node, and the second electronic device 160 is the terminal device, or the first electronic device 110 is the terminal device, and the second electronic device 160 is the interface node. In another example, the first electronic device 110 can be a terminal device, and the second electronic device 160 can also be a terminal device, such as in device-to-device communications between two vehicles.

In an example, the interface node, such as a base transceiver station, a Node B, an evolved Node B (eNB), a next generation Node B (gNB), and the like, includes hardware components and software components configured to enable wireless communications between the interface node and electronic devices that have subscribed services of the telecommunication service provider. The interface node is suitably coupled with other nodes, such as core nodes, other interface nodes, and the like of the telecommunication service provider.

In an example, the terminal device is user equipment used by an end-user for mobile telecommunication, such as a cell phone, a smart phone, a tablet computer, a laptop, a wearable device and the like. In another example, the terminal device is a stationary device, such as a desktop computer. In another example, the terminal device is a machine type communication (MTC) device, such as a wireless sensor, an Internet of things (IoT) device and the like. For example, the terminal device is a MTC device used in massive MTC (mMTC). In another example, the terminal device is an URLLC device used in tele-surgery, intelligent transportation, industry automation, and the like.

In some examples, the first electronic device 110 needs to transmit a data unit, such as a code block having a set of information bits, to the second electronic device 160. The first electronic device 110 encodes the data unit to generate a codeword including the data unit and a set of parity bits. The set of parity bits carries redundancy information for error correction. According to aspects of the disclosure, the codeword can be generated based on a base matrix having multiple weight-2 rows. In an embodiment, the base matrix having rows and columns can include elements having values corresponding to either a first state or a second state, and a weight-2 row having two elements with values corresponding to the first state. One of the two elements can be a parity element corresponding to a parity bit associated with the weight-2 row, and other elements in a same column as the parity element have values corresponding to the second state. In an embodiment, values corresponding to the first state can be 1, and values corresponding to the second state can be 0. For example, the base matrix has elements of 0 and 1 where elements of 1 are sparse. There are two non-zero elements in each weight-2 row including the parity element. In an example, the set of parity bits in the codeword can include a first set of parity bits and a second set of parity bits. The second set of parity bits can be generated based on the weight-2 rows of the base matrix.

FIG. 2A shows an exemplary first codeword 201 according to an embodiment of the disclosure. A data unit 202 having a set of information bits is encoded to generate the first codeword 201 by adding redundancy, a first set of parity bits 203. The first codeword 201 having $n_1$ bits includes the data unit 202 of a bit length k and the first set of parity bits 203 of a bit length $(n_1-k)$, where $n_1$ and k are positive integers, and $n_1$ is larger than k. A bit of the first codeword 201 is $v_i$, where $i=1, 2, \ldots, n_1$. In an embodiment, a bit $v_i$ is an information bit when $i=1, 2, \ldots, k$, and a bit $v_i$ is a parity bit when $i=k+1, 2, \ldots, n_1$. In an example, CR is a ratio of a bit length of a set of information bits over a bit length of a codeword, thus, a first CR of the first codeword 201 is a ratio of the bit length k over the bit length $n_1$.

In an embodiment, the first set of parity bits 203 having a bit length of $(n_1-k)$ can be generated from $(n_1-k)$ equations referred to as check node equations. Each check node equation specifies a relationship between a subset of the first set of parity bits 203 and a subset of the data unit 202. In an embodiment, the $(n_1-k)$ equations are described by a sparse PCM that is sparse based on a low-density parity check (LDPC) code, having $(n_1-k)$ rows and $n_1$ columns of elements of 0 and 1. A column i correspond to a bit $v_i$, and the column i or the bit $v_i$ are referred to as a variable node $v_i$, where $i=1, 2, \ldots, n_1$. A row m is referred to as a check node $c_m$ associated with a check node equation m, where $m=1, 2, \ldots, (n_1-k)$. In an example, the check node equation of the row m specifies that summation of the variable nodes $v_i$ in the row m, where $i=1, 2, \ldots, n_1$, is, modulo 2, 0, as described by, $$\sum_{i=1}^{n1} v_i = v_1 + v_2 + \ldots + v_{n1} = 0 \quad \text{Equation (1)}$$

In general, when an element (x, y) of the PCM is 1, a check node $c_x$ and a variable node $v_y$ are related to each other. When an element (x, y) of the PCM is 0, the check node $c_x$ and the variable node $v_y$ are not related to each other. In general, a check node can be related to multiple variable nodes. A variable node can be related to one or more check nodes. Therefore, the PCM can specify the relationships of the check nodes and the variable nodes, thus, the PCM can be used in encoding and decoding in LDPC codes.

In an embodiment, a PCM having $n_1$ columns can generate a codeword having a bit length of $n_1$. In some examples, codewords having multiple bit lengths are used. For example, in 5G mobile and wireless communications, codewords can have bit lengths from 40 to 4000, thus, requiring a vast number of different PCMs to generate. Therefore, a specific class of LDPC codes constructed from a template is used, the template is referred to as protograph, and the specific class of LDPC codes are referred to as protograph LDPC codes. The protograph serves as a blueprint for constructing PCM of different sizes. A protograph LDPC code can be generated based on a lifting factor (Z), and the lifting factor can be used to indicate the size of the protograph.

In an embodiment, a QC-LDPC code, a sub-class of protograph LDPC codes can be used. The QC-LDPC code can be constructed from a base matrix (template) and one or more shift-coefficient tables. FIG. 2C shows an exemplary base matrix 220 and an exemplary shifting-coefficient table 230 according to an embodiment of the disclosure. In an example, the base matrix 220 is a relative small matrix of binary values. Each element in the base matrix 220 is referred to as an edge. Binary "1" of an edge indicates that a quasi-cyclic (QC) matrix can be constructed at the edge to form a PCM, and binary "0" of an edge indicates that a matrix of zero values can be constructed at the edge to form the PCM. The QC-LDPC code is based on the PCM.

A shift-coefficient table 230 includes column-shifting values for edges in the base matrix 220 to construct a QC matrix from, for example, an identity matrix. For example, when the shift-coefficient table includes "0", such as shown by 232, for an edge in the base matrix 220, then the QC matrix for the edge can be constructed by cyclic shifting columns in an identity matrix by "0" column. Similarly, when the shift-coefficient table includes "7", such as shown by 231, for an edge in the base matrix 220, then the QC matrix for the edge can be constructed by cyclic shifting columns in an identity matrix by "7" columns.

A size of the QC matrix is the lifting factor. For example, the lifting factor can be 8, 16, 24, 32, 48, 64, 96, 128, 192, 256, 384, and the like. In FIG. 2C, the lifting factor is 8, and the size of the identity matrix and each QC matrix is 8 by 8. The lifting factor can be adjusted based on a bit length of a codeword.

The PCM can be generated based on the base matrix 220 and the shifting-coefficient table 230. Referring to FIG. 2C, the base matrix 220 and the shifting-coefficient table 230 can be configured to generate a PCM having 32 rows and 64 columns of elements 0 and 1. Note that the base matrix 220 and the PCM have a same CR. The first electronic device 110 and the second electronic device 160 can use the base matrix 220 to generate a plurality of PCMs based on a plurality of lifting factors and respective shifting-coefficient tables, thus, one base matrix can be used to generate codewords of various bit lengths.

During wireless communications, the first codeword 201 can be distorted by, for example, noise of communication channels, thus the received codeword can be different from the first codeword 201. Decoding methods can be employed to recover the first codeword 201, for example, based on the PCM that generates the first codeword 201. In an embodiment, iterative methods, such as message-passing type algorithms, can be used to decode the first codeword 201. For example, the iterative methods can include Sum-Product algorithm, Offset Min-Sum algorithm, and the like. In an embodiment, an initial statistical estimate associated with a variable node $v_i$ can be obtained from the received codeword without decoding. In an example, the initial statistical estimate is a log likelihood ratio (LLR) associated with the variable node $v_1$ based on, for example, a received signal, communication channel noise characteristics, and the like. For example, the initial statistical estimate of the LLR is also referred to as a prior LLR associated with the variable node $v_i$. Subsequently, a series updates of statistical estimates can be iteratively generated by an iterative method, such as message-passing type algorithms, based on, for example, the initial statistical estimates and two types of iterative operations until the decoded codeword satisfies the check node equations, or the iterative method is exhausted.

The two types of iterative operations are check node (CN) operations and variable node (VN) operations. In general, the CN operations and the VN operations are performed iteratively for the $(n_1-k)$ check nodes and the $n_1$ variable nodes based on the PCM having $(n_1-k)$ rows and $n_1$ columns. In an embodiment, the decoding complexity increases with an increase of a number of check nodes, i.e., a number of rows of the PCM, and a number of non-zero elements in the PCM.

In some applications, such as URLLCs, a lower CR is required to provide an ultra-reliable communication even when communication channels are noisy. For example, a CR from ⅓ to ⅕ can be sufficient for some enhanced mobile broadband (eMBB) applications, however, a much lower CR, for example a CR lower than 1/10, may be required for some URLLC applications. In order to decrease the CR, redundancy is increased by increasing a number of parity bits, thus a number of rows in a PCM. Therefore, a more reliable communication is achieved by increasing the decoding complexity and latency of the communication. Further, directly extending a PCM to very low CR can decrease coding gain. According to aspects of the disclosure, a base matrix can be extended by adding a plurality of weight-2 rows to the base matrix used in QC-LDPC codes, thus decreasing a CR without increasing the decoding complexity and latency, thus achieving reliable and low latency communications. Further, when the base matrix is extended, a respective PCM generated based on the base matrix is also extended.

Figure 2D:
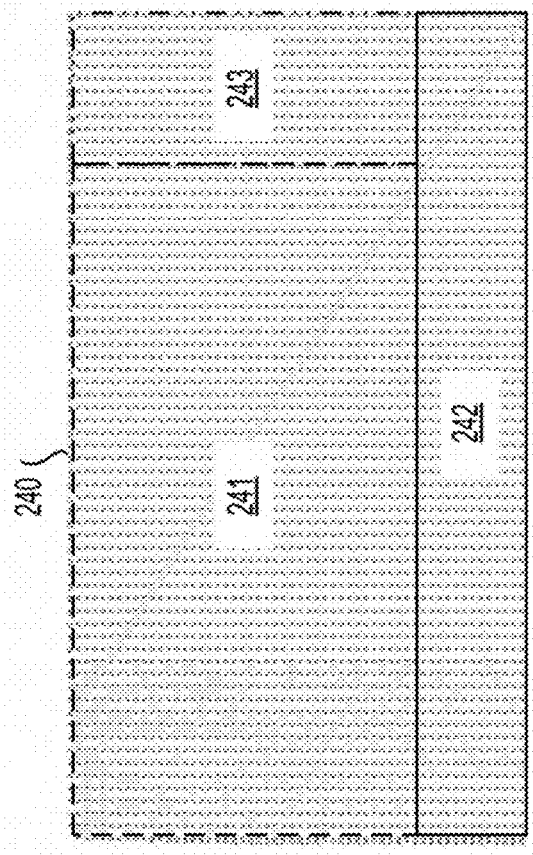
FIG. 2D shows an exemplary second base matrix 240 according to an aspect of the disclosure.

FIG. 2D shows an exemplary second base matrix 240 according to an aspect of the disclosure. The second base matrix 240 includes a first base matrix 241 and an extension base matrix 242. Each row of the extension base matrix 242 can be a weight-2 row. The second base matrix 240 also includes an appendix matrix 243 having elements of 0. In an embodiment, the first base matrix 241 is a base matrix used in QC-LDPC having a first CR. In order to obtain a second CR smaller than the first CR, the extension base matrix 242 can be added to the first base matrix 241 to obtain the second base matrix 240. In an example, the first base matrix 241 can be a base graph 2 (BG2) used in 5G NR LDPC codes. For example, the BG2 can include 42 rows and 52 columns. In another example, the first base matrix 241 can be a base graph 1 (BG1) used in 5G NR LDPC codes. For example, the BG1 can include 46 rows and 68 columns.

In an embodiment, a first PCM having $(n_1-k)$ rows and $n_1$ columns can be generated using the first base matrix 241, a shift-coefficient table, and a lifting factor Z. The first PCM can have a first CR of $k/n_1$. In an example, $(n_1-k)$ parity bits in the first set of parity bits 203 is generated using the first PCM and the data unit 202, forming the first codeword 201 having the data unit 202 and the first set of parity bits 203. Similarly, a second PCM having $(n_2-k)$ rows and $n_2$ columns can be generated using the second base matrix 240, a shift-coefficient table, and the lifting factor Z, where $n_2$ is larger than $n_1$. The second PCM can have a second CR of $k/n_2$. Note that the second PCM includes the first PCM and an extension PCM generated from the extension matrix 242. In an example, a second codeword 215 including k information bits in the data unit 202, $(n_1-k)$ parity bits in a third set of parity bits 213, and $(n_2-n_1)$ parity bits in a second set of parity bits 214 is generated using the second PCM. The second set of parity bits 214 corresponds to the extension PCM.

As described above, the first CR $k/n_1$ can be obtained from the first base matrix 241 or the first PCM. Similarly, the second CR $k/n_2$ can be obtained from the second base matrix 240 or the second PCM. Note that a plurality of CRs can be obtained from various submatrices of a base matrix or a PCM. For example, when the first base matrix 241 is the BG1 including 46 rows and 68 columns, a plurality of CRs can be obtained from submatrices of the BG1, for example, resulting in a CR of 8/9, ⅔, ½, and ⅓. Note that the lowest CR of ⅓ can be obtained from the BG1. In an embodiment, extending a base matrix or a PCM can decrease the lowest CR obtained based on the base matrix or the PCM.

Figure 2E:
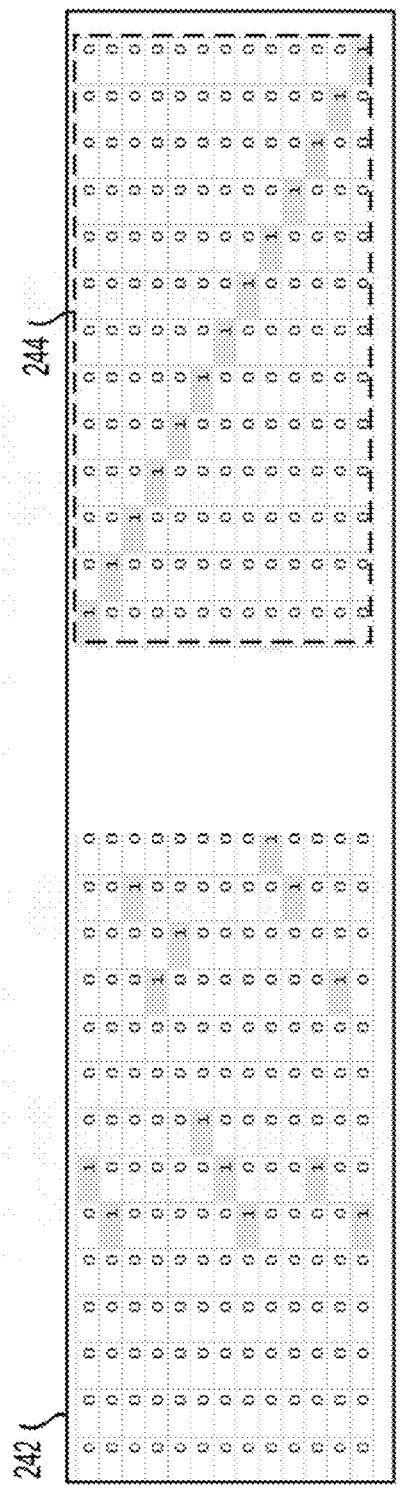
FIG. 2E shows an exemplary extension base matrix 242 according to an aspect of the disclosure.

FIG. 2E shows an exemplary extension base matrix 242 according to an aspect of the disclosure. There are two features associated with the extension base matrix 242. First, there are two edges that are non-zero in each row of the extension base matrix 242. In an embodiment, one non-zero edge corresponds to the second set of parity bits 214, and is referred to as a parity edge. In an example, the other non-zero edge corresponds to information bits. Secondly, each parity edge is located in a different column in the extension base matrix 242. In an example, the parity edges form a diagonal of an identity matrix 244 as shown in FIG. 2E.

There are also two features associated with the extension PCM. First, there are two non-zero elements including a parity element in each row of the extension PCM. In an embodiment, the other non-zero element corresponds to an information bit. The parity element corresponds to a parity bit in the second set of parity bits 214. Secondly, each parity element is located in a different column in the extension PCM. In an example, the parity elements form a diagonal of an identity matrix.

Figure 2F:
FIG. 2F shows an exemplary row 250 according to an aspect of the disclosure.

FIG. 2F shows an exemplary row 250 according to an aspect of the disclosure. In an example, the row 250 can be a row m from the extension PCM, and two non-zero elements (m, i) and (m, j) correspond to a variable node $v_i$ and a variable node $v_j$, respectively. In an embodiment, the variable node $v_i$ corresponds to an information bit $v_i$, and a variable node $v_j$ corresponds to an parity bit $v_j$ of the second set of parity bits 214. In an example, the check node equation of the row m specifies that summation of the variable nodes $v_i$ and $v_j$ is, modulo 2, 0, as described by, $$\sum_{k=1}^{n2} v_k = v_i + v_j = 0 \qquad \text{Equation (2)}$$

Accordingly, the parity bit $v_j$ equals to the variable node $v_i$, i.e., $v_i = v_j$. Therefore, the second set of parity bits 214 can be generated using the extension PCM, the data unit 202, and the third set of parity bits 213. Further, the third set of parity bits 213 is identical to the first set of parity bits 203 because of the two features associated with the second PCM.

In general, a check node equation for a weight-2 row, such as equation (2), includes two variable nodes while another check node equation for a row having more than two non-zero elements, such as equation (1), includes more than two variable nodes. As described below, weight-2 rows can be added to a base matrix to decrease a CR without increasing decoding complexity and latency, thus achieving reliable and low latency communications.

According to aspects of the disclosure, two encoding steps can be implemented to generate the second codeword 215. First, the first set of parity bits 203 (or the third set of parity bits 213) can be generated using the first PCM, a submatrix of the second PCM, and the data unit 202. Secondly, the second set of parity bits 214 can be generated using the extension PCM, a submatrix of the second PCM having weight-2 rows, and the first codeword 201. In an embodiment, the second set of parity bits 214 can be generated using the extension PCM and the data unit 202.

Referring to FIG. 2B, the second codeword 215 includes the first codeword 201 and the second set of parity bit 214. Alternatively, the second codeword 215 includes the data unit 202, the first set of the parity bit 203, and the second set of parity bit 214. According to aspects of the disclosure, in order to lower the first CR of the first codeword 201, a retransmission of a subset of bits of the first codeword 201 can be implemented. The subset of bits of the first codeword 201 being retransmitted can be determined according to error correction instructions stored, for example, in memory 112. In an embodiment, the subset of bits of the first codeword 201 being retransmitted can be the second set of parity bits 214. In an example, the subset of bits of the first codeword 201 can include bits from the data unit 202 and the first set of parity bits 203. In another example, the subset of bits of the first codeword 201 can include bits from the data unit 202. In an example, the first codeword 201 is transmitted followed by transmitting the subset of bits of the first codeword 201. In another example, the subset of bits of the first codeword 201 can be transmitted followed by transmitting the first codeword 201. Note that a sequence of bits in the second codeword 215 being transmitted can be suitably adjusted according to applications.

Referring to FIGS. 2E-2F, the variable node $v_j$ is related to the variable node $v_i$ and the row m. The variable node $v_j$ is not related to other variable nodes and rows because other elements of the column j in the second PCM are zero. Therefore, decoding a received second codeword 215 based on the second PCM can be similar to decoding a received first codeword 201 based on the first PCM. In an embodiment, a CN operation related to the row m is based on an initial statistical estimation associated with the variable node $v_j$, and does not iterate because of the two features associated with the extension PCM. Accordingly, the CN operations related to the extension PCM or rows $n_1+1$ to $n_2$ in the second PCM (as well as parity bits in the second set of parity bits 214) do not iterate. Further, complexity of CN operations related to rows 1 to $n_1$ of the second PCM is not affected by the extension PCM. Therefore, the CN operations based on the second PCM have similar decoding complexity to that of the CN operations based on the first PCM.

Since the variable node $v_j$ is not related to other rows and variable nodes, there is no VN operation based on the row m and the variable node $v_j$. Accordingly, there are no VN operations for the variable nodes associated with the second set of parity bits of 214. Effect of the row m on VN operations associated with the variable node $v_i$ can be taken into account by including the initial statistical estimate associated with the variable node $v_j$ in an initial statistical estimate of the variable node $v_i$. In an example, a summation of the initial statistical estimates of the variable node $v_i$ and $v_j$ can be obtained, for example, using a hardware component in a LDPC decoder 484 in FIG. 4. Further, the summation can replace the initial statistical estimate of the variable node $v_i$ in respective VN operations. Hence, VN operations based on rows 1 to $n_1$ have similar decoding complexity to VN operations based on the first PCM. Accordingly, the CN and VN operations based on rows 1 to $n_1$ of the second PCM have similar decoding complexity to the CN and VN operations based on the first PCM. Further, the CN operations related to rows $n_1+1$ to $n_2$ of the second PCM do not iterate, and there are no VN operations related to rows $n_1+1$ to $n_2$ of the second PCM. Therefore, the decoding complexity related to the second PCM or the second base matrix 240 remains similar to that based on the first PCM or the first base matrix 241.

In an embodiment, the initial statistical estimate associated with the variable node $v_j$ is identical to the CN operation related to the row m. Therefore, when the initial statistical estimates associated with the variable nodes corresponding to the second set of parity bits 215 are implemented, the CN operation related to the extension PCM or rows $n_1+1$ to $n_2$ in the second PCM can be omitted.

Referring back to FIG. 1 example, the transmission 151 transmits wireless signals carrying the second codeword 215. The second electronic device 160 receives wireless signals corresponding to the second codeword 215. The received wireless signals can be corrupted due to for example, noise, signal distortion, interference, and the like. The second electronic device 160 decodes the received signals, and performs error correction based on the second base matrix 240 or the second PCM.

In the FIG. 1 example, the first electronic device 110 transmits the second codeword 215, and the second electronic device 160 receives the second codeword 215. It is noted that the second electronic device 160 can be configured to transmit a codeword and the first electronic device 110 can be configured to receive the codeword in the same or similar manner in the example.

Specifically, in the FIG. 1 example, the first electronic device 110 includes a first transceiver 113 and a first baseband processing circuit 120 coupled together. The first electronic device 110 includes other suitable components, such as processors 111, the memory 112, and the like. The memory 112 can store an base matrix 118 having multiple weight-2 rows. In an example, the base matrix 118 is the second base matrix 240 including the first base matrix 241 and the extension base matrix 242. In another embodiment, the memory 112 can be configured to store a plurality of base matrices, such as an encoding base matrix having multiple weight-2 rows, a decoding base matrix having multiple weight-2 rows, and the like. In another embodiment, the memory 112 can be configured to store a base matrix having multiple weight-2 rows that is used in encoding and decoding. In another example, multiple base matrices having multiple weight-2 rows for different applications can be stored in the memory 112. In an embodiment, the memory 112 can store the error correction instructions used to determine the subset of bits of the first codeword 201 being retransmitted. In the FIG. 1 example, the components are coupled together by a bus architecture. It is noted that other suitable interconnection techniques can be used.

The second electronic device 160 includes a second transceiver 163 and a second baseband processing circuit 170 coupled together. The second electronic device 160 includes other suitable components, such as processors 161, memory 162, and the like. The memory 162 can store a base matrix 168 having multiple weight-2 rows. In an example, the base matrix 168 is the second base matrix 240 including the first base matrix 241 and the extension base matrix 242. In another embodiment, the memory 162 can be configured to store a plurality of base matrices, such as an encoding base matrix having multiple weight-2 rows, a decoding base matrix having multiple weight-2 rows, and the like. In another embodiment, the memory 162 can be configured to store a base matrix having multiple weight-2 rows that is used in encoding and decoding. In another example, multiple base matrices having multiple weight-2 rows for different applications can be stored in the memory 162. In an embodiment, the memory 162 can store the error correction instructions used to determine the subset of bits of the first codeword 201 being retransmitted. In the FIG. 1 example, the components are coupled together by a bus architecture. It is noted that other suitable interconnection techniques can be used.

The memory 112 and the memory 162 can be any suitable device for storing data. In an embodiment, the memory 112 and the memory 162 can be non-volatile memory, such as read-only memory, flash memory, magnetic computer storage devices, hard disk drives, solid state drives, floppy disks, and magnetic tape, optical discs, and the like. In an embodiment, the memory 112 and the memory 162 can be a random access memory (RAM). In an embodiment, the memory 112 and the memory 162 can include non-volatile memory and volatile memory.

Further, in the example, the first baseband processing circuit 120 includes a transmission processing circuit 130, a reception processing circuit 145 and a control circuit 140 coupled together. The transmission processing circuit 130 includes a LDPC encoder 133 based on the base matrix 118 having weight-2 rows. In an embodiment, the LDPC encoder 133 can be configured to encode using a PCM generated from the base matrix 118, a lifting factor, and a shift-coefficient table. For example, the PCM is the second PCM including the extension PCM having rows with two non-zero elements.

The second baseband processing circuit 170 includes a reception processing circuit 180, a transmission processing circuit 195, a control circuit 190 coupled together. The reception processing circuit 180 includes a LDPC decoder 184. In an embodiment, the LDPC decoder 184 is based on the base matrix 168 having weight-2 rows. In an embodiment, the LDPC decoder 184 can be configured to decode using a PCM generated from the base matrix 168. For example, the PCM is the second PCM including the extension PCM having rows with two non-zero elements. In an embodiment, the LDPC decoder 184 is based on the error correction instructions.

The first transceiver 113 is configured to receive and transmit wireless signals. In an example, the first transceiver 113 includes a receiving circuit RX 116 and a transmitting circuit TX 115. The receiving circuit RX 116 is configured to generate electrical signals in response to captured electromagnetic waves by an antenna 114, and process the electrical signals to extract digital samples from the electrical signals. For example, the receiving circuit RX 116 can filter, amplify, down convert, and digitalize the electrical signals to generate the digital samples. The receiving circuit RX 116 can provide the digital samples to the first baseband processing circuit 120 for further processing.

In an example, the transmitting circuit TX 115 is configured to receive digital stream (e.g., output samples) from the first baseband processing circuit 120, process the digital stream to generate radio frequency (RF) signals, and cause the antenna 114 to emit electromagnetic waves in the air to carry the digital stream. In an example, the transmitting circuit TX 115 can convert the digital stream to analog signals, and amplify, filter and up-convert the analog signals to generate the RF signals.

In some embodiments, the transmission processing circuit 130 is configured to receive a transport block (e.g., a packet), and generate the digital stream corresponding to the transport block. In an example, the processors 111 execute software instructions to form upper layers of a protocol stack (e.g., data link layer, network layer, transport layer, application layer and the like), and the processors 111 generate a transport block following the protocol stack. In an example, the bottom of the upper layers of protocol stack is a data link layer, the data link layer outputs the transport block, and the processors 111 provide the transport block to the first baseband processing circuit 120. The first baseband processing circuit 120 forms a physical layer for the protocol stack in an example. The transmission processing circuit 130 receives the transport block and processes the transport block to generate the digital stream, and provide the digital stream to the transmitting circuit TX 115 for transmission.

The reception processing circuit 145 is configured to receive the digital samples from the receiving circuit 116 and process the received digital samples.

In an example, the transmission processing circuit 130 partitions the transport block into a plurality of code blocks. The transmission processing circuit 130 then processes the code blocks according to suitable coding and modulation scheme. For example, the code blocks can be encoded for example using suitable channel coding techniques, such as error detection coding technique, rate matching coding technique, LDPC coding technique, polar coding technique and the like. In an example, the transmission processing circuit 130 includes the LDPC encoder 133 based on the base matrix 118. In an example, the base matrix 118 is the second base matrix 240, and the second PCM including weight-2 rows can be generated from the second base matrix 240. The processed code blocks are suitably modulated and multiplexed to generate the digital stream. For example, the code blocks can be modulated using suitable modulation technique, such as quadrature phase shift keying (QPSK), quadrature amplitude modulation (QAM), 16QAM, 64QAM, 256QAM, and can be multiplexed using suitable multiplexing technique, such as frequency-division multiplexing (FDM), time-division multiplexing (TDM), a combination of FDM and TDM, and the like.

In an example, a lifting factor Z is generated by the control circuit 140 based on a bit length of a codeword. Subsequently, a shifting coefficient table is generated by the control circuit 140 based on the lifting factor Z and the base matrix 118, such as the second base matrix 240.

Similarly, the second transceiver 163 is configured to receive and transmit wireless signals. In an example, the second transceiver 163 includes a receiving circuit RX 166 and a transmitting circuit TX 165. The receiving circuit RX 166 is configured to generate electrical signals in response to captured electromagnetic waves by an antenna 164, and process the electrical signals to extract digital samples from the electrical signals. For example, the receiving circuit RX 166 can filter, amplify, down convert, and digitalize the electrical signals to generate the digital samples. The receiving circuit RX 166 can provide the digital samples to the second baseband processing circuit 170 for further processing.

In an example, the transmitting circuit TX 165 is configured to receive a digital stream (e.g., output samples) from the second baseband processing circuit 170, process the digital stream to generate radio frequency (RF) signals, and cause the antenna 164 to emit electromagnetic waves in the air to carry the digital stream. In an example, the transmitting circuit TX 165 can convert the digital stream to analog signals, and amplify, filter and up-convert the analog signals to generate the RF signals.

In the FIG. 1 example, the second baseband processing circuit 170 is configured to receive and process digital samples received from the receiving circuit RX 166 and provide digital streams to the transmitting circuit TX 165. In an embodiment, in the second baseband processing circuit 170, the reception processing circuit 180 is configured to receive the digital samples, process the digital samples to generate a decoded data unit and provide the decoded data unit to the processors 161 for further processing. In an example, the processors 161 execute software instructions to form upper layers of a protocol stack, and the processors 161 can process the decoded data unit following the protocol stack. In an example, the second baseband processing circuit 170 forms a physical layer for the protocol stack, the bottom of the upper layers formed by the processors 161 is a data link layer. The physical layer can output the data unit in the form of a transport block and provide the transport block to the data link layer for further processing.

In an embodiment, the reception processing circuit 180 receives digital samples of the transmission, de-multiplexes and demodulates the digital samples to generate a received code block, and decodes the received code block. In an embodiment, the LDPC decoder 184 based on the base matrix 168 is configured to decode the received code block. In an example, the LDPC decoder 184 can be configured to use a PCM generated from the base matrix 168, such as, the second base matrix 240. Accordingly, the PCM is the second PCM including the extension PCM having rows with two non-zero elements. In an example, the base matrix 168 stored in the memory 162 is identical to the base matrix 118 stored in the memory 112. In an embodiment, the LDPC decoder 184 is based on the error correction instructions.

It is noted that the first baseband processing circuit 120 and the second baseband processing circuit 170 can be respectively implemented using various techniques. In an example, a baseband processing circuit is implemented as integrated circuits. In another example, a baseband processing circuit is implemented as one or more processors executing software instructions.

It is also noted that while single antenna per device is used in the FIG. 1 example, the communication 100 can be suitably modified to use multiple input, multiple output (MIMO) antenna technology.

Figure 3:
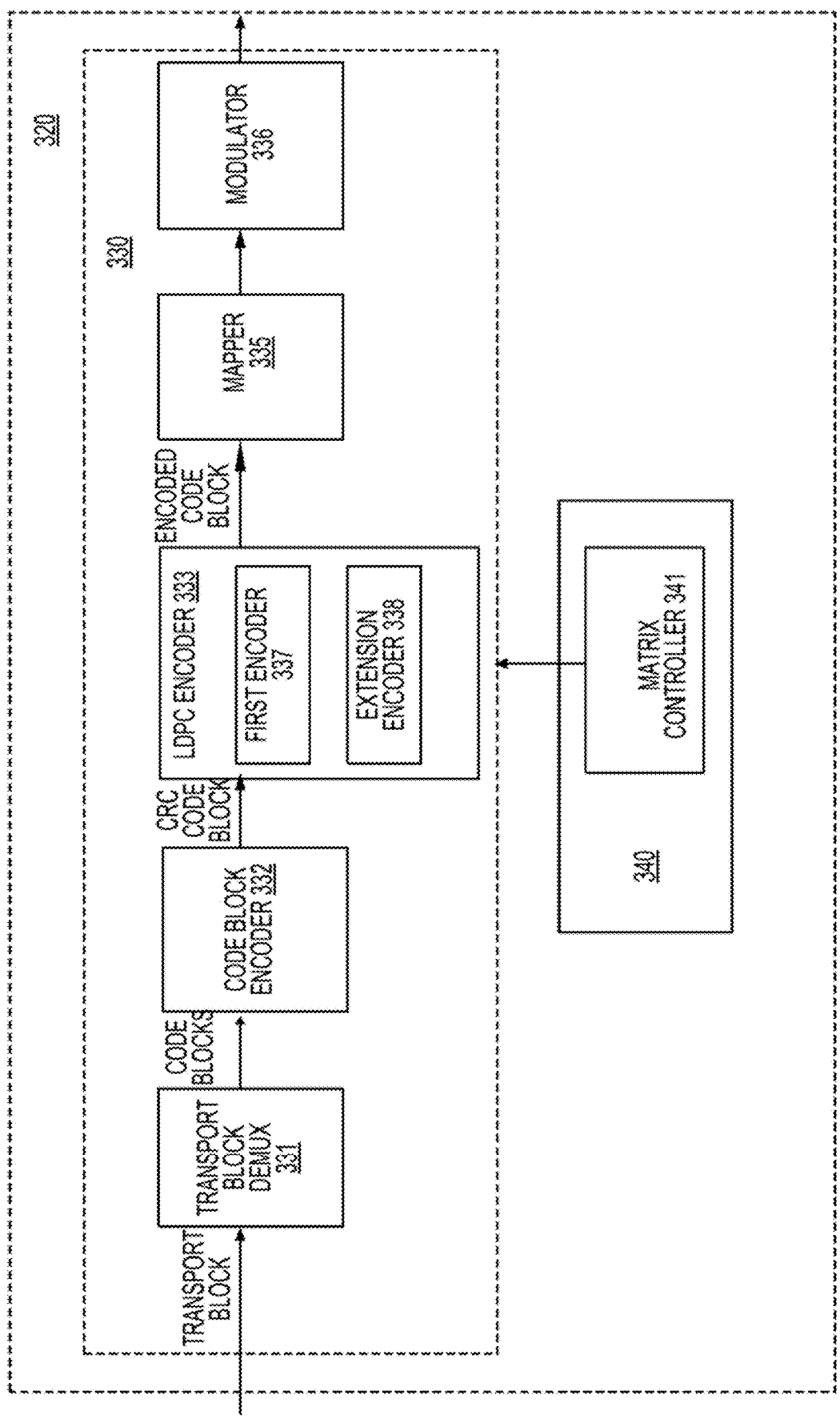
FIG. 3 shows a block diagram of an exemplary baseband processing circuit 320 according to an embodiment of the disclosure.

FIG. 3 shows a block diagram of an exemplary baseband processing circuit 320 according to an embodiment of the disclosure. In an example, the baseband processing circuit 320 is used in the first electronic device 110 in the place of the first baseband processing circuit 120.

The baseband processing circuit 320 includes a transmission processing circuit 330 and a control circuit 340 coupled together as shown in FIG. 3. The transmission processing circuit 330 includes a transport block de-multiplexer (DE-MUX) 331, a code block encoder 332, a LDPC encoder 333, a mapper 335 and a modulator 336 coupled together. The control circuit 340 includes various control modules for configuring and controlling operations of the baseband processing circuit 320. In the FIG. 3 example, the control circuit 340 includes a matrix controller 341.

The transport block DEMUX 331 is configured to receive a transport block of a data packet, encode the transport block for transport block level error detection, and partition the encoded transport block to output a plurality of code blocks. In an example, the transport block DEMUX 331 is configured to calculate cyclic redundancy check (CRC) bits based on the transport block, and add the CRC bits into the transport block to generate the encoded transport block. Further, the transport block DEMUX 331 is configured to partition the encoded transport block into a plurality of code blocks. The plurality of code blocks are respectively processed by the code block encoder 332, the LDPC encoder 333, and the mapper 335 in an example.

It is noted that, in another example, the code block encoder 332, the LDPC encoder 333, and the mapper 335 form a code block processing path. The baseband processing circuit 320 can include multiple code block processing paths that are configured to parallel process the plurality of code blocks. Then, the modulator 336 can multiplex output from the multiple code block processing paths.

In an example, the code block encoder 332 is configured to receive a code block, encode the code block for code block level error detection to generate a CRC code block. In an example, the code block encoder 332 is configured to calculate cyclic redundancy check (CRC) bits based on the code block, and add the CRC bits into the code block to generate the CRC code block. In an example, bits in the CRC code block are referred to as information bits.

In an embodiment, the LDPC encoder 333 can be configured to operate on the CRC code block using a PCM having weight-2 rows to enable error correction. In an example, the PCM can be generated by the matrix controller 341 based on the base matrix 118, a respective shift-coefficient table, and a lifting factor. In an example, the base matrix 118 is the second base matrix 240 including the first base matrix 241 and the extension base matrix 242, and the PCM is the second PCM generated from the second base matrix 240, including the first PCM and the extension PCM having two non-zero elements in each row. The PCM can also be stored in the memory 112.

The LDPC encoder 333 receives the information bits (encoded code block), and encodes the information bits based on the PCM to generate a codeword (encoded information bits). In an example, the encoded code block is the data unit 202 having a bit length of k, and the codeword is the second codeword 215 having a bit length of $n_2$ generated based on the second PCM. In an embodiment, The LDPC encoder 333 can further include a first encoder 337 and an extension encoder 338. The first encoder 337 can generate the first set of parity bits 203 using the first PCM and the data unit 202. The extension encoder 338 can generate the second set of parity bits 214 using the extension PCM and the first codeword 201. Alternatively, the second set of parity bits 214 corresponds to the subset of bits of the first codeword 201 being retransmitted. Note that the first PCM can be generated from the first base matrix 241. The extension PCM can be generated from the extension base matrix 242.

The mapper 335 maps the selected portion of the encoded code block to data symbols according to suitable modulation scheme. The modulator 336 then performs modulation on the data symbols and generates output samples.

The matrix controller 341 can be configured to generate a PCM used by the LDPC encoder 333 based on the base matrix 118, a shift-coefficient table, and a lifting factor.

In an embodiment, a circular buffer module can be employed between the LDPC encoder 333 and the mapper 335. The circular buffer module is configured to buffer the second codeword 215 in a circular buffer, and output a selected portion of the buffered codeword based on a redundancy version. In an example, the circular buffer is formed in a memory, such as the memory 112. In an example, a memory space in the memory 112 is allocated to form the circular buffer. The circular buffer is referred to as virtual circular buffer in some examples.

In some embodiments, the second codeword 215 is punctured, and punctured codeword is buffered in the circular buffer. In an example, the two columns worth of information bits are punctured before buffering. The puncture of information bits can provide a performance advantage.

It is noted that the baseband processing circuit 320 can be implemented using various techniques. In an example, the baseband processing circuit 320 is implemented as integrated circuits. In another example, the baseband processing circuit 320 is implemented as one or more processors executing software instructions.

Figure 4:
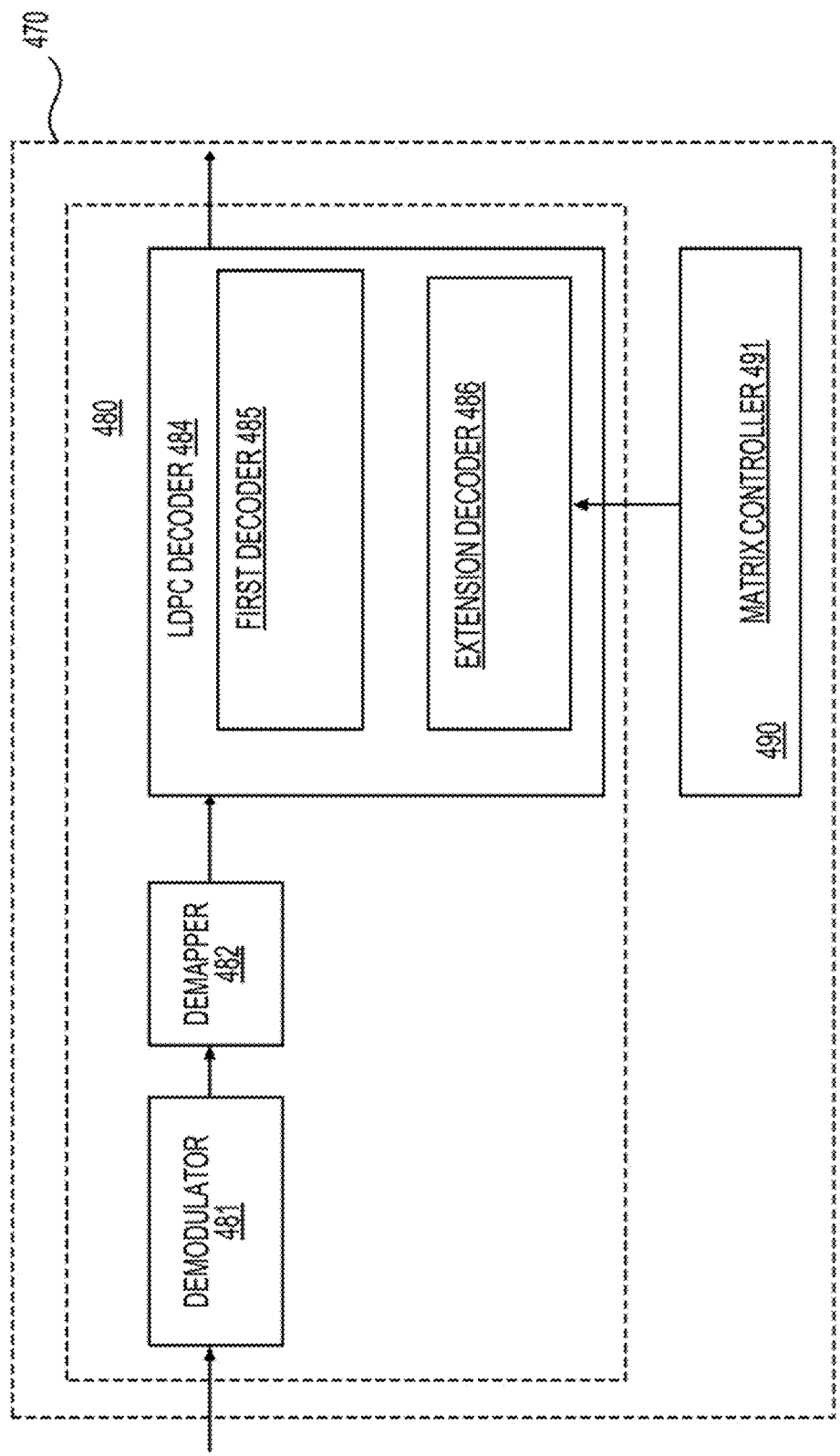
FIG. 4 shows a block diagram of an exemplary baseband processing circuit 470 according to an embodiment of the disclosure.

FIG. 4 shows a block diagram of an exemplary baseband processing circuit 470 according to an embodiment of the disclosure. In an example, the baseband processing circuit 470 is used in the second electronic device 160 in the place of the second baseband processing circuit 170.

The baseband processing circuit 470 includes a reception processing circuit 480 and a control circuit 490 coupled together as shown in FIG. 4. The reception processing circuit 480 further includes a demodulator 481, a de-mapper 482, a LDPC decoder 484 coupled together as shown in FIG. 4. The control circuit 490 includes a matrix controller 491.

In an embodiment, the baseband processing circuit 470 receives digital samples, and process the digital samples to generate decoded code block. For example, the demodulator 481 is configured to receive the digital samples, perform demodulation on the digital samples to generate data symbols during each of the symbol periods. The demapper 482 separates data symbols for the subcarriers during each symbol period, and determines data symbols respectively for the code block, and provides the data symbols corresponding to the code block to the LDPC decoder 484.

The LDPC decoder 484 processes data symbols for the code block to decode the code block. In an embodiment, the LDPC decoder 484 can be configured to operate on the data symbols for the code block using a PCM having weight-2 rows. The PCM can be generated by the matrix controller 491 based on the base matrix 168, a respective shift-coefficient table, and a lifting factor. In an example, the base matrix 168 is the second base matrix 240 including the first base matrix 241 and the extension matrix 242 having two non-zero edges in each row, and the PCM is the second PCM generated from the second base matrix 240. The second PCM includes the first PCM and the extension PCM. The PCM can also be stored in the memory 162. In an example, the base matrix 168 and the base matrix 118 are identical.

In an embodiment, the second PCM including the first PCM and the extension PCM can be employed by the LDPC decoder 484 to decode a received second codeword 215. Note that the second codeword 215 includes the first codeword 201 and the second set of parity bits 214, thus, the received second codeword includes a received first code-word and a received second set of parity bits. As described above, the second PCM includes $(n_2-k)$ rows and $n_2$ columns. Rows $n_1$ to $n_2$ corresponds to the extension PCM and the second set of parity bits 214, and have two non-zero elements in each row.

In an example, the LDPC decoder 484 can include a first decoder 485, an extension decoder 486. Referring to FIG. 2F, a CN operation related to the row m is based on an initial statistical estimation associated with the parity bit $v_j$, and does not iterate. Accordingly, the extension decoder 486 can be configured to implement non-iterative CN operations related to rows $n_1+1$ to $n_2$ of the second PCM. The first decoder 485 can be configured to implement iterative CN operations and VN operations related to rows 1 to $n_1$ of the second PCM. Referring to FIG. 2E, effect of the row m on VN operations associated with the variable node $v_1$ can be taken into account by including an initial statistical estimate associated with the variable node $v_j$ in an initial statistical estimate of the variable node $v_i$. In an example, a summation of the initial statistical estimates of the variable nodes $v_i$ and $v_j$ can be obtained, for example, using a hardware component in the extension decoder 486, and replace the initial statistical estimate of the variable node $v_i$ in the iterative VN operations related to rows 1 to $n_1$ in the first decoder 485.

In an embodiment, the initial statistical estimate associated with the variable node $v_j$ is identical to the CN operation related to the row m. Therefore, when the initial statistical estimates associated with the variable nodes corresponding to the second set of parity bits 215 are implemented, the CN operation related to the extension PCM or rows $n_1+1$ to $n_2$ in the second PCM can be omitted. As a result, the extension decoder 486 can be omitted.

In an embodiment, the LDPC decoder 484 can be configured to operate on the data symbols for the code block using a parity check matrix and the error correction instructions used to retransmit the subset of first codeword 201.

It is noted that the baseband processing circuit 470 can be implemented using various techniques. In an example, the baseband processing circuit 470 is implemented as integrated circuits. In another example, the baseband processing circuit 470 is implemented as one or more processors executing software instructions.

Figure 5:
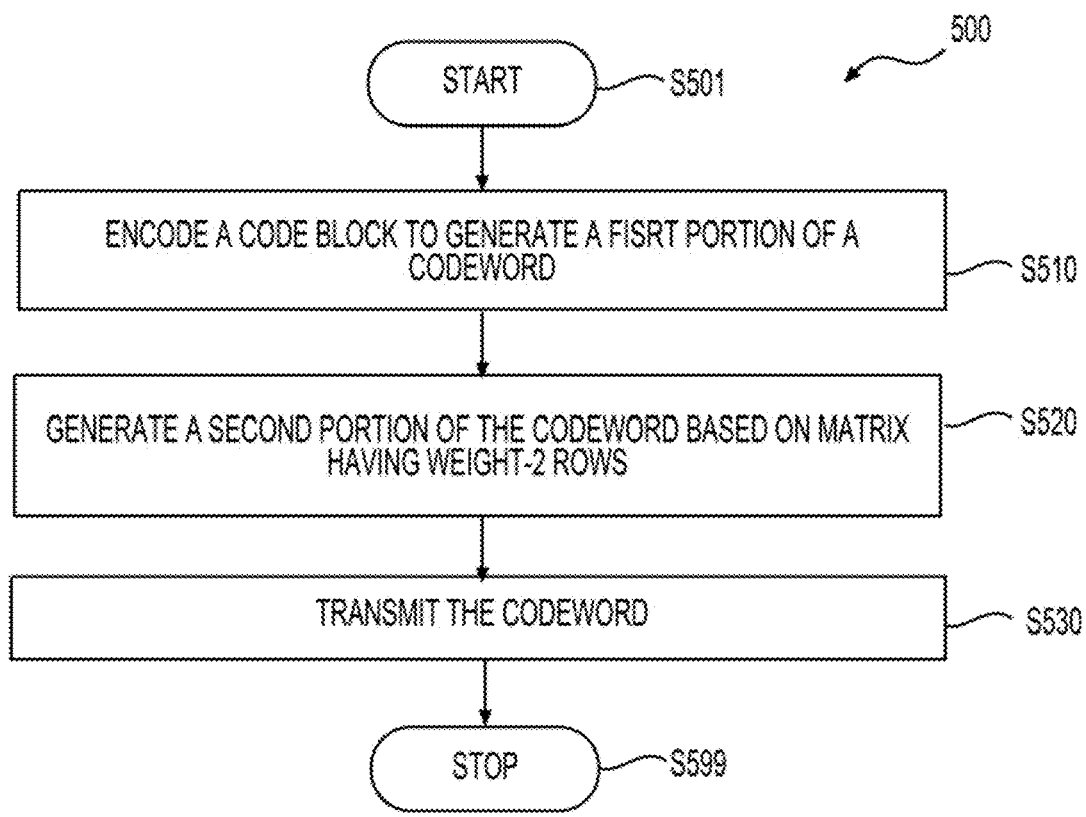
FIG. 5 shows a flow chart outlining an exemplary process 500 according to an embodiment of the disclosure.

FIG. 5 shows a flow chart outlining an exemplary process 500 according to an embodiment of the disclosure. In an example, the process 500 is executed by an electronic device, such as the first electronic device 110 in the FIG. 1 example. For example, the process 500 can be used to implement QC-LDPC encoding based on the base matrix 118 to generate the second codeword 215. The process starts at S501 and proceeds to SS 10.

At S510, a code block is encoded to generate a first portion of a codeword. In the FIG. 1 example, a transport block is encoded to add CRC bits. The encoded transport block is partitioned into a plurality of code blocks. For each code block, the first electronic device 110 adds CRC bits in the code block to generate a CRC code block. The bits in the CRC code block are referred to as information bits. The CRC code block is encoded based on a QC-LDPC code to generate a first portion of a codeword. The first portion of the codeword includes the information bits and parity bits.

In an embodiment, the QC-LDPC code is based on the base matrix 118 stored in the memory 112. According to aspects of the disclosure, the base matrix 118 can be the second base matrix 240 including the first base matrix 241 and the extension base matrix 242 having two non-zero edges in each row. In an example, the CRC code block is the data unit 202 having a bit length of k.

In order to encode the CRC code block, the first PCM is generated from the first base matrix 241, for example, by the matrix controller 341. The data unit 202 or the CRC code block is encoded using the first PCM into the first portion of a codeword by, for example, the first encoder 337. The first portion of the codeword is the first codeword 201.

At S520, a second portion of the codeword is generated based on matrix having weight-2 rows. In an embodiment, the second PCM is generated from the second base matrix 240, for example, by the matrix controller 341. The second portion of the codeword is generated using the extension PCM of the second PCM by, for example, the extension encoder 338. The second portion of the codeword is the second set of parity bits 214. In an example, the codeword is the second codeword 215 including the data unit 202 (the CRC code block), the first set of parity bits 203, and the second set of parity bits 214 (the second portion of the codeword).

At S530, the codeword is transmitted. In an example, the second codeword 215 is transmitted. The process proceeds to S599 and terminates.

Alternatively, after the first portion of the codeword, such as the first codeword 201, is generated at S510, the first portion of the codeword can be transmitted. In addition, a subset of bits of the first portion of the codeword, determined based on the error correction instructions, can be retransmitted. The subset of bits of the first portion of the codeword being retransmitted can be the second portion of the codeword. The process proceeds to S599 and terminates.

Figure 6:
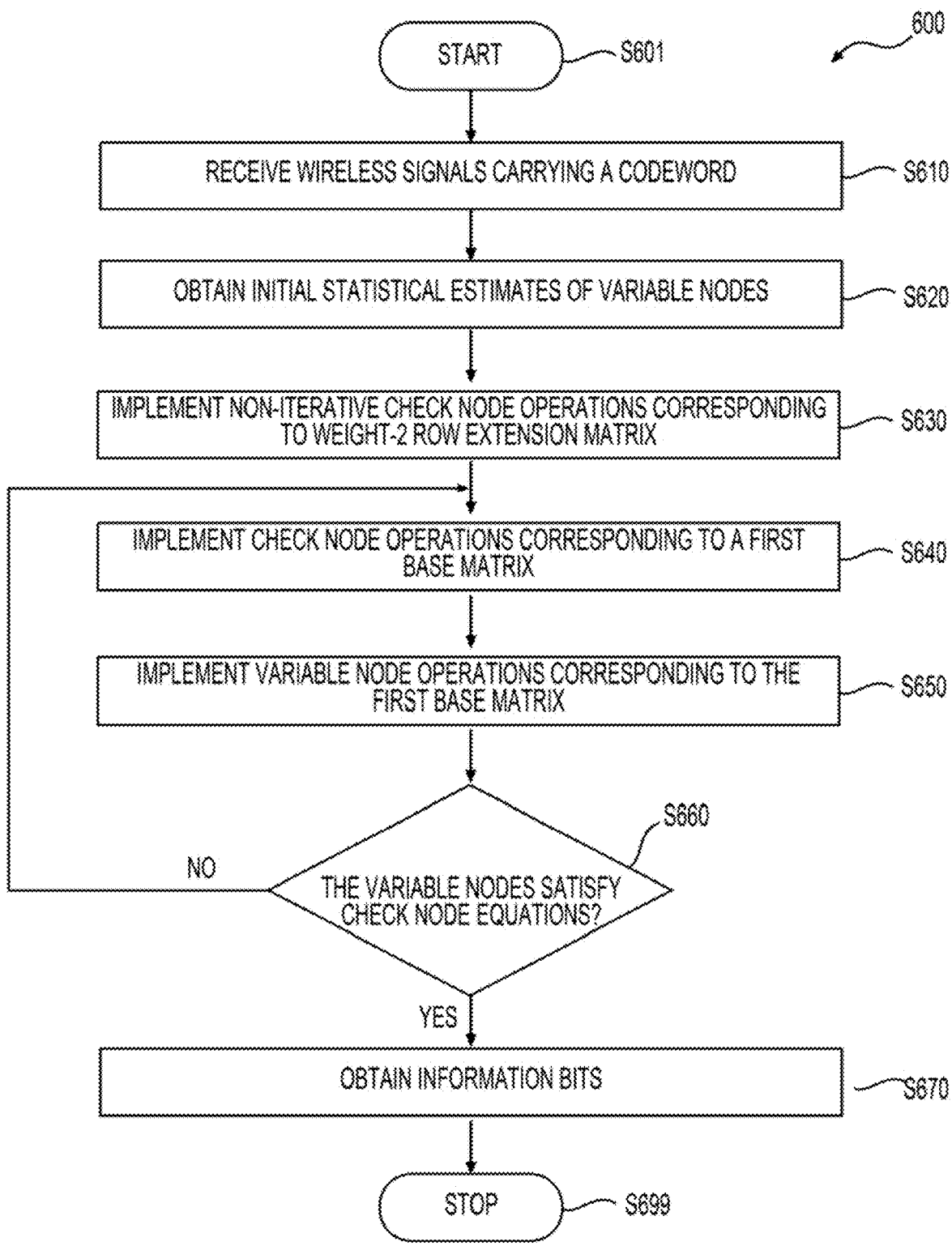
FIG. 6 shows a flow chart outlining an exemplary process example 600 according to an embodiment of the disclosure.

FIG. 6 shows a flow chart outlining an exemplary process 600 according to an embodiment of the disclosure. In an example, the process 600 is executed by an electronic device, such as the second electronic device 160 in the FIG. 1 example. For example, the process 600 can be used to implement QC-LDPC decoding based on the base matrix 168. The process starts at S601 and proceeds to S610.

At S610, wireless signals carrying a codeword are received.

In an embodiment, the process 600 can be used to implement QC-LDPC decoding based on a matrix having weight-2 rows. For example, a PCM can be generated by the matrix controller 491 based on the base matrix 168, a respective shift-coefficient table, and a lifting factor. In an example, the base matrix 168 is the second base matrix 240 including the first base matrix 241 and the extension matrix 242 having two non-zero edges in each row, and the PCM is the second PCM generated from the second base matrix 240. The second PCM includes the first PCM and the extension PCM. As described above, the second PCM includes $(n_2-k)$ rows and $n_2$ columns. Rows $n_1$ to $n_2$ corresponds to the extension PCM and the second set of parity bits 214.

In an example, the received codeword is the second codeword 215 generated based on the base matrix 118. The received second codeword 215 includes a received first codeword 203 and a received second set of parity bits 214. In an example, a statistical method such as a belief propagation method can be used.

At S620, initial statistical estimates of variable nodes can be obtained, for example, based on a received signal, a signal to noise ratio, and the like. For example, the initial statistical estimate can be a prior log-likelihood ratio (LLR). In an example, the received second codeword 215 includes a received first codeword 203 and a received second set of parity bits 214. As described above, initial statistical estimates of one or more variable nodes can be modified by initial statistical estimates of respective variable nodes corresponding to the second set of parity bits 214.

At S630, non-iterative CN operations related to weight-2 row extension matrix are implemented. In an example, the weight-2 row extension matrix is the extension matrix corresponding to the extension PCM, thus, non-iterative CN operations related to rows $n_1+1$ to $n_2$ corresponding to the extension PCM and the second set of parity bits 214 are implemented. In an embodiment, the initial statistical estimates associated with the variable nodes corresponding to the second set of parity bits 215 can replace the CN operation related to the extension matrix, thus S630 can be omitted.

At S640, CN operations related to the first base matrix is implemented. In an example, the first base matrix 241 corresponds to the first PCM, thus, the CN operations related to rows 1 to $n_1$ corresponding to the first PCM and the first word 203 are implemented.

At S650, VN operations related to the first base matrix is implemented. In an example, the first base matrix 241 corresponds to the first PCM, thus, the VN operations related to rows 1 to $n_1$ corresponding to the first PCM and the first word 203 are implemented.

At S660, the check node equations are checked to see if the variable nodes satisfy the check node equations. A decision can be made for each variable node based on a respective statistical estimate, for example, the variable node $v_1$ is 0, the variable node $v_2$ is 1, and the like. If the variable nodes satisfy the check node equations, the process 600 proceeds to S670. If the variable nodes do not satisfy the check node equations, the process 600 proceeds to S640, and repeat steps S640 and S650 iteratively.

At S670, the information bits of the codeword can be obtained. In an example, the information bits correspond to the data unit 202 of the second codeword 215. The process proceeds to S699, and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An apparatus, comprising:
  memory configured to store a matrix that is used in error correction and is associated with a set of parity bits, the matrix having rows and columns includes:
   elements having values corresponding to either a first state or a second state, the matrix being sparse and including less elements with values corresponding to the first state than elements with values corresponding to the second state; and
   a row having two elements with values corresponding to the first state, one of the two elements being a parity element corresponding to a parity bit associated with the row, other elements in a same column of the matrix as the parity element having values corresponding to the second state; and
  processing circuitry configured to:
   when a lifting factor is larger than 1, form a parity check matrix (PCM) having elements of 0 and 1 from the matrix by:
    replacing each element having a value corresponding to the first state with a quasi-cyclic (QC) matrix column-shifted according to a shift-coefficient table from an identity matrix, a size of the identity matrix corresponding to the lifting factor; and replacing each element having a value corresponding to the second state with a zero matrix having the size of the identity matrix; and implement error correction based on one of the matrix and the PCM.

2. The apparatus of claim 1, wherein the processing circuitry is further configured to implement error correction by generating the set of parity bits from a data unit based on the matrix or the PCM and to encode the data unit into a codeword that includes the data unit and the set of parity bits.

3. The apparatus of claim 1, wherein the processing circuitry is further configured to receive a codeword including a data unit and the set of parity bits, and to implement error correction by decoding the codeword based on the matrix or the PCM and to generate a decoded data unit.

4. The apparatus of claim 1, wherein the matrix or the PCM is used in a quasi-cyclic low density parity check (QC-LDPC) code.

5. The apparatus of claim 4, wherein the processing circuitry is further configured to generate the shift-coefficient table.

6. The apparatus of claim 4, wherein the processing circuitry is configured to encode/decode using a LDPC code based on the PCM.

7. The apparatus of claim 1, wherein the matrix further includes a second row, and the matrix includes a submatrix having the second row and an extension matrix having the row.

8. The apparatus of claim 1, wherein the memory is a non-volatile memory.

9. The apparatus of claim 1, wherein the lifting factor is 1, the matrix is a parity check matrix used in a LDPC code, and an element having a value corresponding to the first state is 1 and an element having a value corresponding to the second state is 0.

10. An apparatus, comprising:
processing circuitry configured to:
generate a digital signal that includes a data unit and a first set of parity bits used for error correction;
transmit the digital signal;
generate a second set of parity bits that corresponds to a retransmission of a subset of bits from the data unit and/or the first set of parity bits based on error correction instructions that include a matrix having elements with values corresponding to either a first state or a second state and a row having two elements with values corresponding to the first state, one of the two elements being a parity element corresponding to a parity bit associated with the row, other elements in a same column of the matrix as the parity element having values corresponding to the second state, the matrix being sparse and including less elements with values corresponding to the first state than elements with values corresponding to the second state; and
transmit the second set of parity bits; and
memory configured to store the error correction instructions.

11. The apparatus of claim 10, wherein the error correction instructions include characteristics of the subset of bits in the digital signal to be retransmitted.

12. A method, comprising:
storing a matrix that is used in error correction and is associated with a set of parity bits, and the matrix having rows and columns includes:
elements having values corresponding to either a first state or a second state, the matrix being sparse and including less elements with values corresponding to the first state than elements with values corresponding to the second state; and
a row having two elements with values corresponding to the first state, one of the two elements being a parity element corresponding to a parity bit associated with the row, other elements in a same column of the matrix as the parity element having values corresponding to the second state;
when a lifting factor is larger than 1, forming a parity check matrix (PCM) having elements of 0 and 1 from the matrix by:
replacing each element having a value corresponding to the first state with a quasi-cyclic (QC) matrix column-shifted according to a shift-coefficient table from an identity matrix, a size of the identity matrix corresponding to the lifting factor; and
replacing each element having a value corresponding to the second state with a zero matrix having the size of the identity matrix; and
encoding/decoding a digital signal based on one of the matrix and the PCM.

13. The method of claim 12, wherein the digital signal is a data unit having a set of information bits, and encoding the digital signal is implemented by generating the set of parity bits from the data unit based on the matrix or the PCM and to form a codeword including the data unit and the set of parity bits.

14. The method of claim 12, wherein the method further includes receiving a digital signal including a data unit and the set of parity bits, and decoding the digital signal is implemented by decoding based on the matrix or the PCM to generate a decoded data unit.

15. The method of claim 12, wherein the matrix or the PCM is used in LDPC code.

16. A method, comprising:
generating a digital signal that includes a data unit and a first set of parity bits used for error correction;
transmitting the digital signal;
generating a second set of parity bits that corresponds to a retransmission of a subset of bits from the data unit and/or the first set of parity bits based on error correction instructions that include a matrix having elements with values corresponding to either a first state or a second state and a row having two elements with values corresponding to the first state, one of the two elements being a parity element corresponding to a parity bit associated with the row, other elements in a same column of the matrix as the parity element having values corresponding to the second state, the matrix being sparse and including less elements with values corresponding to the first state than elements with values corresponding to the second state;
transmitting the second set of parity bits; and
storing the error correction instructions.

* * * * *